US008580685B2

(12) United States Patent
Aton et al.

(10) Patent No.: US 8,580,685 B2
(45) Date of Patent: Nov. 12, 2013

(54) INTEGRATED CIRCUIT HAVING INTERLEAVED GRIDDED FEATURES, MASK SET, AND METHOD FOR PRINTING

(75) Inventors: Thomas J. Aton, Dallas, TX (US); Donald Plumton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/447,629

(22) Filed: Apr. 16, 2012

(65) Prior Publication Data
US 2012/0220133 A1 Aug. 30, 2012

Related U.S. Application Data

(62) Division of application No. 12/114,624, filed on May 2, 2008, now Pat. No. 8,173,544.

(51) Int. Cl.
*H01L 21/00* (2006.01)

(52) U.S. Cl.
USPC .................. 438/674; 438/5; 438/694

(58) Field of Classification Search
USPC ............................. 438/674, 5, 694
See application file for complete search history.

(56) References Cited

U.S. PATENT DOCUMENTS

| | | | |
|---|---|---|---|
| 6,238,850 B1 * | 5/2001 | Bula et al. | 430/394 |
| 6,530,645 B2 * | 3/2003 | Haflinger | 347/41 |
| 6,787,469 B2 * | 9/2004 | Houston et al. | 438/689 |
| 6,813,757 B2 * | 11/2004 | Aton et al. | 716/53 |
| 7,074,547 B2 * | 7/2006 | Hoshino | 430/311 |
| 7,906,253 B2 * | 3/2011 | Aton et al. | 430/5 |
| 7,906,271 B2 * | 3/2011 | Aton | 430/312 |
| 8,083,958 B2 * | 12/2011 | Li et al. | 216/41 |
| 8,173,544 B2 * | 5/2012 | Aton et al. | 438/674 |
| 2003/0084420 A1 * | 5/2003 | Aton et al. | 716/19 |
| 2003/0215967 A1 * | 11/2003 | Shizukuishi | 438/22 |
| 2004/0229135 A1 * | 11/2004 | Wang et al. | 430/5 |
| 2009/0087619 A1 * | 4/2009 | Aton et al. | 428/156 |
| 2009/0087754 A1 * | 4/2009 | Aton | 430/5 |
| 2009/0125871 A1 * | 5/2009 | Aton et al. | 716/21 |
| 2009/0148795 A1 * | 6/2009 | Li et al. | 430/312 |
| 2009/0273100 A1 * | 11/2009 | Aton et al. | 257/786 |
| 2009/0315932 A1 * | 12/2009 | Dimitrijevic et al. | 347/12 |
| 2010/0167537 A1 * | 7/2010 | Aton | 438/674 |
| 2012/0220133 A1 * | 8/2012 | Aton et al. | 438/703 |

FOREIGN PATENT DOCUMENTS

WO WO 2004077162 A1 * 9/2004

* cited by examiner

*Primary Examiner* — Laura Menz
(74) *Attorney, Agent, or Firm* — Alan A. R. Cooper; W. James Brady, III; Frederick J. Telecky, Jr.

(57) ABSTRACT

A method for fabricating an integrated circuit includes the steps of: providing a substrate having a semiconductor surface; providing a hardmask material on the semiconductor surface. For at least one masking level of the integrated circuit: providing a mask pattern for the masking level partitioned into a first mask and at least one second mask, the first mask providing features in a first grid pattern and the at least one second mask providing features in a second grid pattern, wherein the first and the second grid pattern have respective features which interleave with one another over at least one area; applying a first photoresist layer with the first mask; exposing the first grid pattern using the first mask; developing the first photoresist layer; etching the hardmask material to transfer the first grid pattern in the surface of the substrate; removing the first photoresist layer.

17 Claims, 8 Drawing Sheets

INTEGRATED CIRCUIT HAVING INTERLEAVED GRIDDED FEATURES, MASK SET, AND METHOD FOR PRINTING

This application is a divisional of application Ser. No. 12/114,624, filed May 2, 2008.

FIELD OF THE INVENTION

The present invention relates to semiconductor fabrication and integrated circuits, and more specifically to mask arrangements, circuit layouts and printing processes for forming integrated circuits.

BACKGROUND

A photo mask is generally obtained by depositing a Cr (chromium) film on predetermined parts of a glass substrate, serving as light shielding parts. Parts of the glass substrate, not covered with the Cr film, serve as light transmitting parts. Exposure light is transmitted through these light transmitting parts or shielded with these light shielding parts, thus implementing transfer of predetermined mask patterns to a resist or the like as an object for exposure, formed on a semiconductor substrate (wafer). After the transfer of the mask patterns to the resist, patterning is executed on the photoresist, and a semiconductor device is fabricated using the resist as patterned.

The lithography tool's light source provides wavelength limited light to an illuminator. The illuminator is composed of mirrors and light pipes which shape the light to the necessary spatial uniformity and intensity across surface of the mask. Between the mask and the photoresist coated wafer is a lens. In the exposure step, the resist is irradiated with light from the illuminator through the photo mask, to the lens, then to the resist covered wafer surface. As a result, a latent image of the mask patterns is formed in the resist. Subsequently, upon the development of the resist, parts of the resist, corresponding to the latent image, selectively remain (positive resist) or are selectively removed (negative resist), thereby forming resist patterns on the wafer.

Advanced lithography is generally targeted at the limits of the best currently available lithography optics. The diffraction and contrast effects are limited by the numerical aperture (NA) of the lens, the wavelength of the light doing the exposure, and the properties of the resists for patterning a given level. Hole patterns (e.g. contacts and vias) are generally made by etching holes into layers of dielectrics (e.g. silicon oxide, silicon nitride, silicon oxynitride, etc.) using openings in the resists to determine where the holes will be opened. The best resists are generally positive resists. To make a hole using positive resist requires piling up light into a small spot to remove the resist. Piling up light is harder than its opposite, which is to provide complete darkness. Various physical effects, principally interference, can be used to help make darkness, but generally forcing photons into a small spot is difficult because of diffraction effects.

Along with microminiaturization of the mask pattern, the influence of the optical proximity effect becomes more pronounced, and consequently, the pattern fidelity deteriorates, thereby causing a problem that the resist pattern is found largely deviated from the mask pattern. Resist patterns obtained as a result of a simulation, would be identical in shape and size to respective image patterns without the influence of the optical proximity effect. However, in practice, the actual respective resist patterns obtained are found to be rounder (e.g. not vertical edges) or receding and in some cases merged or not fully opened as compared with the shape of the respective image patterns. Thus, pattern fidelity is found deteriorated due to these optical proximity effects.

Circuit designs generally place features such as contacts and vias at random locations, and conventional mask sets reflect this random nature. Such random placements (especially isolated or semi-isolated placements) have small depth of focus values, that is, they only fully remove the resist when the resist is almost exactly in the best focus plane of the exposure. Small depth of focus values are problematic for the desired wide manufacturing margins and can result in yield loss, such as due to highly resistive or electrically open contacts and vias.

Figure 1:
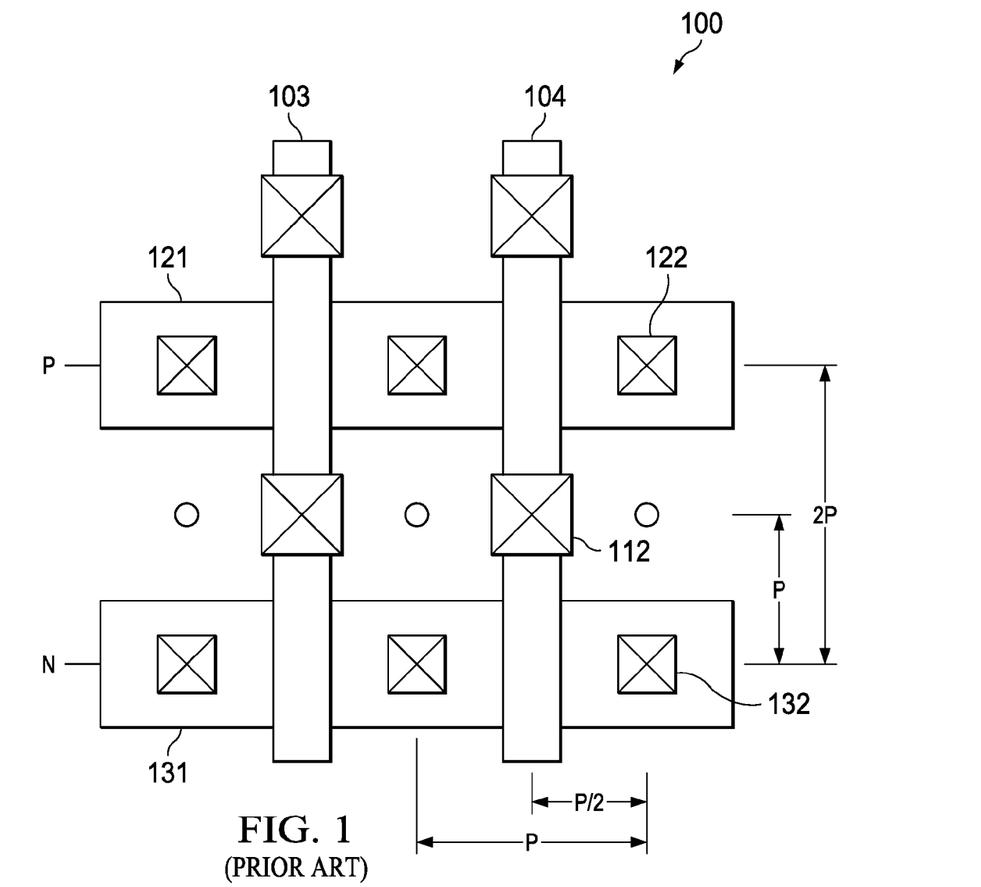
FIG. 1 shows a portion of a known standard cell having a pair of gate electrode (e.g. poly) lines each forming a complementary pair of transistors over active areas, along with their associate contacts.

Even certain regular feature patterns can be difficult to print, particularly when the pitch (center-to-center feature spacing) becomes small. For example, FIG. 1 shows a portion of a standard cell 100 having a pair of gate electrode (e.g. polysilicon) lines 103 and 104 aligned in the vertical direction each forming a complementary pair of transistors by extending from one active area (e.g. p-doped under the gates with n+ on both sides of the gates) 121 to another active area (e.g. n-doped under the gates with p+ on both sides of the gates) 131. As known in the art, sub-resolution assist features are provided on the mask (shown as circles) to provide diffraction support when printing tightly spaced circuit features. Such assist features generally are placed on the mask to provide the optimum diffraction effects to help print the desired regular feature patterns but are themselves chosen to be too small to expose the resist and thus to print on the circuit. Actual contacts for standard cell 100 are shown as squares having Xs inside.

The vertical distance (along the length of the gate lines) between S/D contacts 122 and 132 is shown as "2P". In the vertical direction the minimum pitch between printed contacts, which is between the S/D contacts 122 and 132 and gate contacts 112, is ½ the distance between S/D contacts 122 and 132 and thus equal to "P". However, in the horizontal direction, the minimum pitch, which is between S/D contacts 122 and 132 and gate contacts 112 is equal to P/2.

As known in the art, if circuit features such as the S/D contacts 122 and 132 and gate contacts 112 get too close in either the horizontal or the vertical direction relative to the capabilities of the lithography system, there will generally be insufficient contrast at each of the respective spots of light used for printing and the holes will become "blurred" together via the optical proximity effect. For example, in a current state of the art lithography system having a lens NA of 1.35 operating at λ=193 nm, the smallest feature pitch that can generally be printed is about ⅔λ, or about 130 nm.

As a result, for standard cell 100, S/D contacts 122 and 132 must generally be moved relatively far way in the vertical direction (e.g. from 2P to 4P) for printing problems associated with printing gate contacts at half pitch in the horizontal direction to be reduced. However, moving the S/D and gate contacts apart in the vertical direction undesirably lowers the density of the devices on the wafer, thus raising the cost per die.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

As used herein, the terms "horizontal", "vertical", "rows", "columns", "x", and "y" only each serve to each define orientation in one of the orthogonal directions. As such, these terms are readily interchangeable, since a 90 degree rotation will change one direction to the other orthogonal direction.

In one embodiment of the invention a method for fabricating an integrated circuit comprises the steps of providing a substrate having a semiconductor surface. For at least one masking level (e.g. gate electrode, contact or via) of the integrated circuit a mask pattern is provided for the masking level which is partitioned into a first mask and at least a second mask. The first mask provides features in a first grid pattern and the second mask provides features in a second grid pattern. The first and said second grid pattern have respective features that interleave with one another over at least one area. A first photoresist film is applied onto the surface of the substrate. The first grid pattern is printed using the first mask. The second grid pattern is printed using the second mask. The first and said second grid pattern are then etched into the surface of the substrate. Embodiments of the invention use different resists and separate exposures for printing each grid pattern, as well as a hard mask layer in one embodiment.

In another embodiment of the invention an integrated circuit comprises a substrate having a semiconducting surface, a plurality of interconnected devices formed on the surface, wherein features comprising at least one of contacts or vias are in a feature pattern for interconnecting the devices in at least one multi-transistor area of the integrated circuit comprising at least five transistors. The feature pattern comprises the features arranged in a plurality of rows and columns, wherein a center of the features in each of the rows are positioned within a 10% tolerance from feature positions defined by a constant horizontal grid spacing and a center of the features in each of the columns are positioned within a 10% tolerance from feature positions defined by a constant vertical grid spacing. A minimum horizontal or minimum vertical center-to-center spacing distance between neighboring ones of the features in the pattern is ≤100 nm.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As noted above, circuit designers generally place integrated circuit features such as contacts and vias (generally collectively referred to herein as "holes") at non-constant spacing distances (pitches) from one another, and mask sets for forming the integrated circuits reflect this non-constant nature. Even in the case where the circuit features are generally periodic over small areas of the circuit, such as the standard cell arrangement shown in FIG. 1, the circuit features may become difficult to print using known printing techniques, particularly if the feature pitch becomes small (e.g. 130 nm), for example when some of the features are at positions less than the feature pitch, such as when some features are nearly at half pitch positions.

Referring again to the standard cell portion shown in FIG. 1, as noted above, if the S/D contacts 122 and 132 and gate contacts 112 for circuit 100 get too close in one direction (e.g. the horizontal direction), there will generally be insufficient contrast at each of the respective spots of light for printing with positive resist and the holes will become "blurred" together via the optical proximity effect. Moving the S/D and gates contacts apart in the other direction (e.g. the vertical direction) undesirably lowers density of the devices on the wafer, thus raising the cost per die. Using embodiments of the invention improved control of each of the sets of contacts (or vias) without trading off circuit density is obtained by using a first mask and a second mask, wherein the first mask provides a first grid pattern and the second mask provides a second grid pattern, the two grid patterns together forming an interleaved feature pattern. The first grid pattern can be used to separately print features such as the S/D contacts 122 and 132, such as into a first resist for S/D contacts 122, and the second grid pattern can be used with a second resist to print the gate contacts 112. Each grid pattern can be at a minimum pitch, generally defined herein to be <130 nm (e.g. 120 nm) and will not interfere optically with the other grid because they are in separate resist patterns. As a result, the minimum spacing in circuits according to embodiments of the invention based on neighboring features from the first and second pattern will include at least one and generally a plurality of contacts and/or vias that are spaced from one another in at least one direction (horizontal or vertical)<100 nm, such as <90 nm, <80 nm, <70 nm, <65 nm or <60 nm. Thus, embodiments of the invention can remove the requirement before the invention to lower the density of the devices on the wafer so as to not be required to print closely spaced features, such as between S/D contacts and gate contacts in the horizontal direction for circuit 100 when P<130 nm.

The interleaved grid pattern is in at least one multi-transistor defining area of the mask level generally associated with at least two transistors. The transistor areas can be much larger, such to include >5 transistors, >10 transistors or >20 transistors. A plurality of different interleaved grid patterns can be in different multi-transistor areas on the integrated circuit and can thus include different feature (e.g. hole or line) pitches, the different interleaved grid patterns generally being spaced apart from one another on the circuit. An improved printing effect is generally obtained using embodiments of the invention, particularly for circuits that can be largely partitioned into two (or more) sets of holes (e.g. contacts or vias) or lines that have their respective positions defined by a grid within a certain tolerance, such as <15%, <10%, or <5%, from exact positions defined by the respective grid. Although masks produced according to embodiments of the invention will generally have all feature positions in the grid filled by including sub-resolution assist features (to provide complete diffraction support), circuits formed using the invention will generally include feature patterns that have incomplete grids where a plurality of non-printing assist features on the mask result in no printed feature in the final circuit.

As used herein the term "grid" refers to the centers of all holes or other features (e.g. lines) to be printed within the one or more grid areas being predictable in their location by a mathematical formula, generally a simple mathematical formula, such as a fixed spacing (e.g. 120 nm spacing)±a tolerance (e.g. ±10% or 12 nm). As noted above, mask features on the grids corresponding to sub-resolution assist features will not generally be printed. In some cases, the grid will also include dummy features, i.e., those features which are unconnected to other circuit nodes (e.g. a "dummy gate"). For example, among the simplest and most highly symmetric grids would be a square grid, which comprises crossing points for a set of equally spaced horizontal and vertical lines. The square grid is a special case of a rectangular grid in which the hole centers all align on horizontal and vertical lines, but the horizontal spacing (pitch) is different than the vertical spacing. Other grids may also be used with embodiments of the invention, such as hexagonal grids, such as found in certain DRAM cells. In the case of a rectangular grid, a nearly optimal illuminator for a grid of holes is generally an illuminator with 4 openings at the "inverse" rectangular placement (essentially the Fourier transform of the array on the mask). Such an illuminator will generally provide high contrast and depth of focus (DOF) once the partial grid of desired holes is completed with missing hole(s) being filled by support features as described above.

Figure 2A:
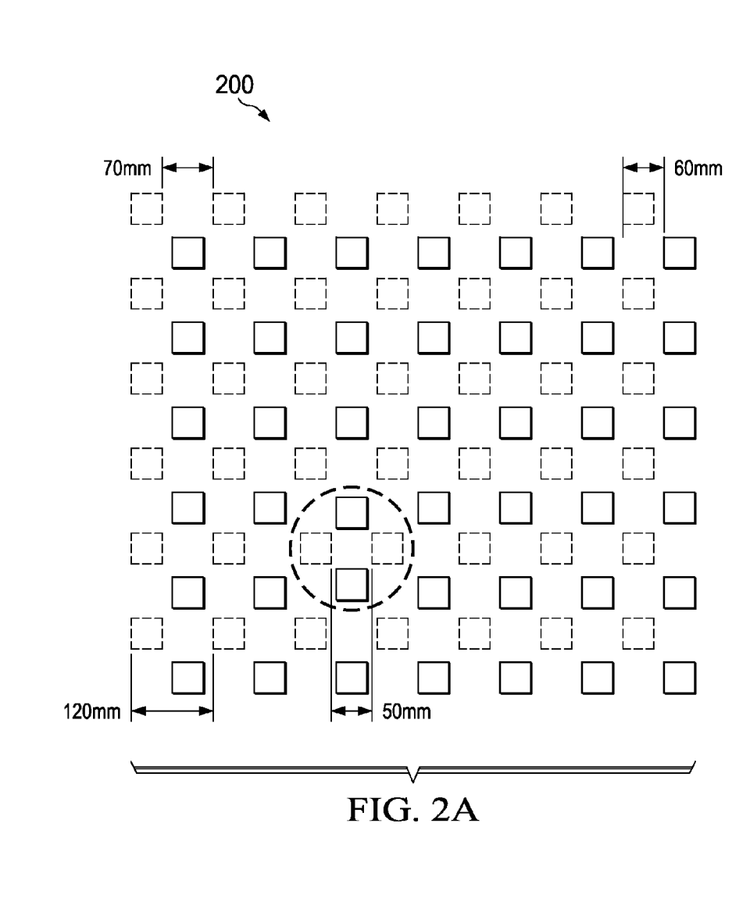
FIG. 2A shows an exemplary interleaved contact grid according to a first embodiment of the invention.

FIG. 2A shows an exemplary contact grid 200 according to an embodiment of the invention derived from a standard-cell based circuit design. Grid 200 is a square grid comprising two interleaved 120 nm×120 nm nominal pitch grids, one shown having solid framed contacts, the other one shown having dashed line framed contacts. There is near half pitch displacement (60 nm) of the respective grids in both orthogonal directions. The center locations of features in neighboring rows are positioned within 20% of midpoints of horizontal locations of centers of features in neighboring rows, and center locations of features in neighboring columns are positioned within 20% of midpoints of vertical locations of centers of the features in neighboring columns. The minimum spacing of feature edges shown is 50 nm in the circled region. Given an overall pitch of 120 nms (which is taken here to represent the minimum pitch which may be reliably printed for a optical system with approximate values of about NA=1.35 and λ=193 nm), the respective grids shown are at ½ pitch locations relative to one another (centers of holes in one grid being nominally 60 nm from centers of the holes in the other grid in both the x and y direction). Using the invention, one mask is generally made to print the first grid (solid contacts) and a second mask is made to print the second grid (dashed contacts). Although generally described using two masks and two grids, the invention can be practiced with more than two masks and more than 2 grids, such as 3 grids having a 40 nm offset between grids for a 120 nm pitch contact grid.

Figure 2B:
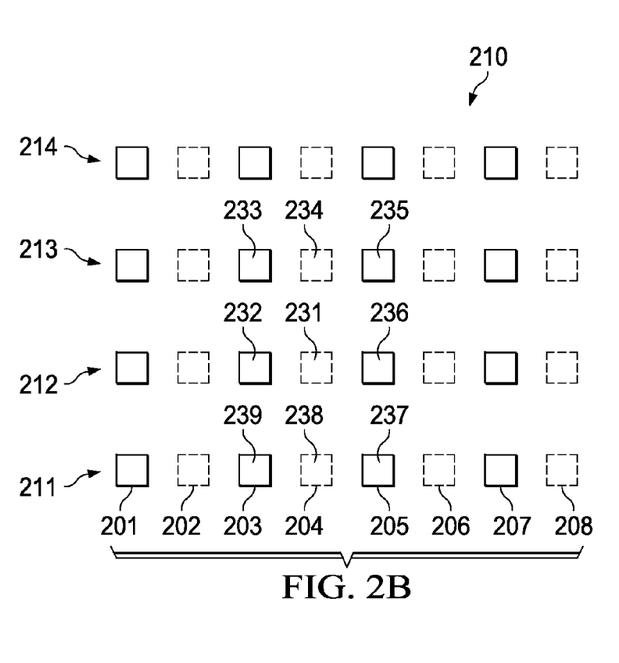
FIG. 2B shows an exemplary interleaved contact grid according to a second embodiment of the invention.

FIG. 2B shows an exemplary contact grid 210 according to an embodiment of the invention derived from a standard-cell based circuit design. Rows 211-214 and columns 201-208 are shown. Being "neighboring" relative to rows and columns as defined herein is based on its ordinary meaning, so that rows 211 and 213 are the neighboring rows relative to row 212, and columns 204 and 206 are neighboring columns relative to column 205. Similarly, contacts 232-239 are considered the neighboring contacts for contact 231.

Grid 210 is a horizontal grid comprising two interleaved grids, one shown having solid framed contacts, the other one shown having dashed line framed contacts. Unlike the grid shown in FIG. 2A which provides half pitch or near half pitch displacement of the respective grids in both orthogonal directions, grid 210 shown in FIG. 2B provides near half pitch (e.g. within 20% of ½ pitch) displacement of the respective grids in only one (horizontal) of the orthogonal directions, with near zero displacement in the other (vertical) orthogonal direction. That is, two grids, both with horizontal pitch $P_h$ and vertical pitch $P_v$ are displaced from each other by $P_h/2$ horizontally (within 20% of $P_h$) and zero vertically (within 20% of $P_v$. As seen by one having ordinary skill in the art, the opposite displacement state (about zero horizontally and $P_v/2$ vertically) can be obtained by simply interchanging the definitions of horizontal and vertical (such as by simply rotating FIG. 2B by ninety degrees), so that it can be seen this embodiment covers displacement by approximately (e.g. within 20%) of ½ pitch in one direction and approximately zero (e.g. within 20%) displacement in the other orthogonal direction.

Partitioning according to the invention can significantly increase the ability to successfully print certain existing feature patterns, such as those having both a grid and half-grid placements of holes (e.g. standard cell portion 100 shown in FIG. 1). The invention can also be applied to provide design rules to guide new layouts that will have circuit designs having new grid-like patterns in one or more areas of the integrated circuit that permit more accurate printing for certain mask levels, including those known to be particularly difficult to pattern (e.g. contact and via).

Figure 2C:
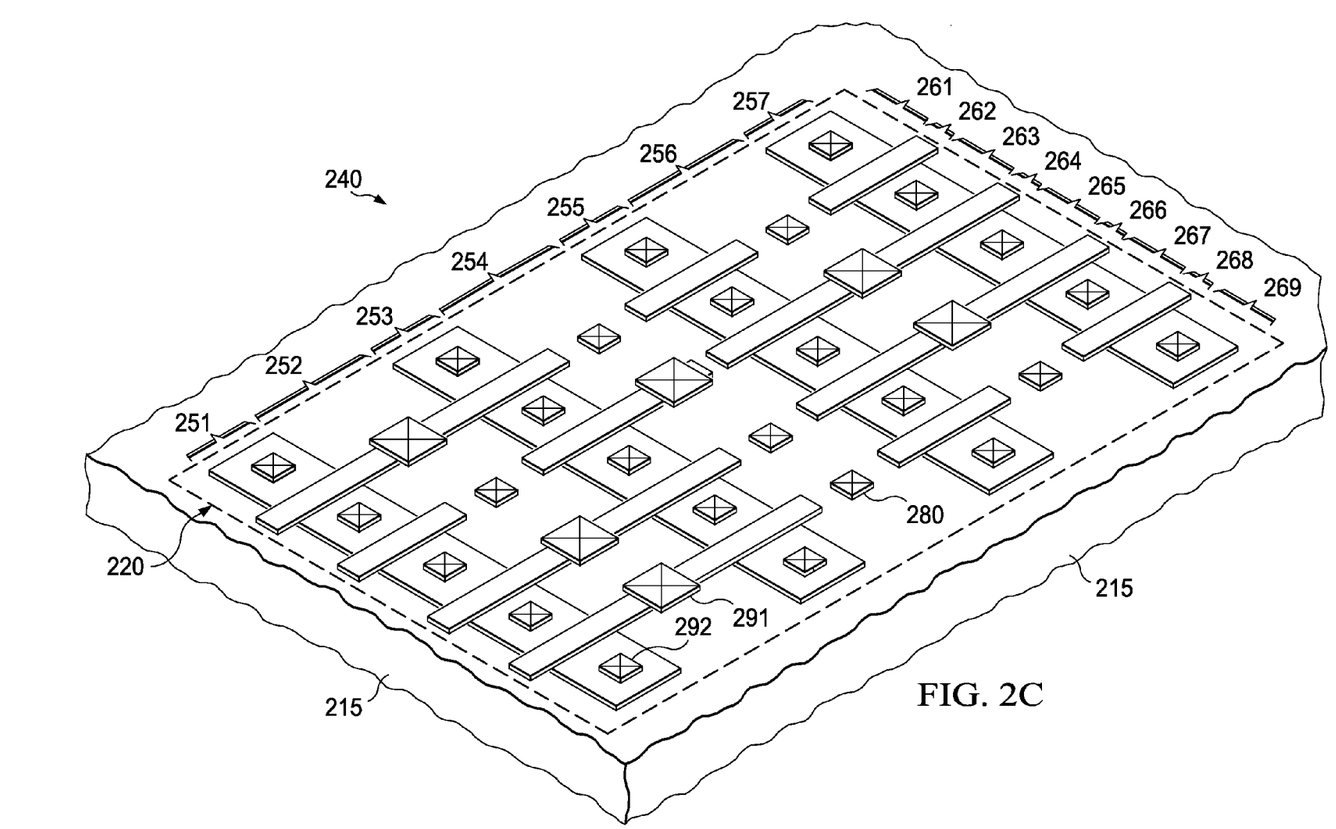
FIG. 2C is a depiction of an integrated circuit according to an embodiment of the invention comprising a substrate having a semiconducting surface, and a plurality of interconnected devices formed on the surface of the substrate.

In embodiment of the inventions, integrated circuits having a new gridded layout are provided. Referring to FIG. 2C, an integrated circuit 240 comprises a substrate 215 having a semiconducting surface, and a plurality of interconnected devices formed on the surface. Integrated circuit 240 is typical of a simple cell that might appear in a standard-cell design. Some non-printed features 280 are also shown. The features shown are contacts that are represented as rectangles having an x within the rectangles. The gridded portion of integrated circuit 240 is shown as reference 220 which comprises a pair of stacked standard cells. Gridded portion 220 comprises the contacts in an interleaved feature pattern for interconnecting the devices comprising at least five transistors.

The feature pattern comprises a plurality of rows 251-257 and columns 261-269. A minimum horizontal or minimum vertical center-to-center spacing distance between neighboring features in the pattern is <100 nm, for example shown as a horizontal distance<100 nm between gate electrode contacts 291 to the S/D contacts 292.

A center of the features in each of the respective rows 251-257 are positioned within a 10% tolerance from feature positions defined by a constant horizontal grid spacing and centers of the features in neighboring ones of the rows (e.g. row 252 relative to neighboring rows 251 and 253) are positioned within 20% of the midpoints of the feature positions defined by neighboring rows. Optional dummy features are shown included, such as the respective features in row 254 corresponding to columns 262, 266 and 268. Dummy features can also be embodied as sub-resolution assist features, which as noted above are designed to not print. A center of the features in the columns 261-269 are positioned within a 10% tolerance from positions defined by a vertical grid spacing and centers of the features in neighboring ones of the columns are positioned within 20% of midpoints of the feature positions defined by neighboring ones of the columns (e.g. column 262 relative to columns 261 and 263).

Figure 3:
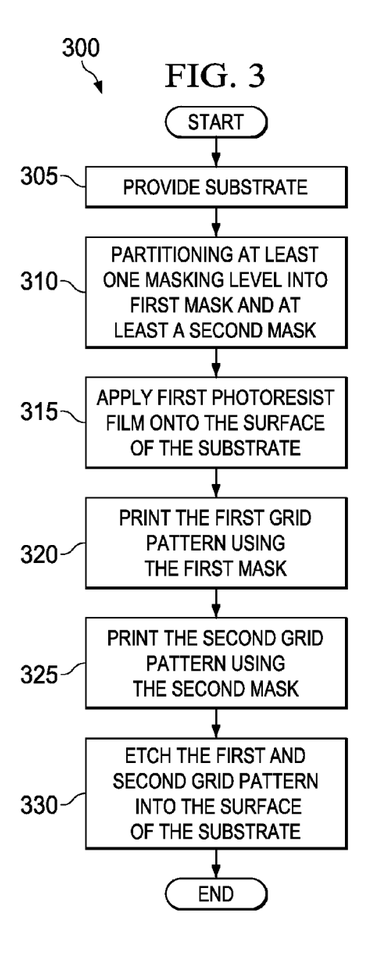
FIG. 3 shows steps in an exemplary method for fabricating an integrated circuit according to an embodiment of the invention.

Now referring to the method of forming integrated circuits, the respective grid patterns for the respective masks for a given mask level (e.g. contact or a via level) using an embodiment of the invention are transferred to the wafer in separate exposure steps. In one embodiment of the invention, both separate lithography and separate etching sequences are used. FIG. 3 shows steps in an exemplary method 300 for fabricating an integrated circuit according to an embodiment of the invention. In step 305, a substrate having a semiconductor surface is provided. In step 310, for at least one masking level of the integrated circuit, such as contact or a via level, a mask pattern for the masking level is partitioned into a first mask and at least a second mask. At least one multi-transistor area of the mask level generally associated with at least five transistors has a feature pattern defined by interleaved first and second grid patterns, wherein the first mask provides the first grid pattern and a second mask provides the second grid pattern. In step 315, a first photoresist film is applied onto the surface of the substrate. In step 320 the first grid pattern is then printed using the first mask. In step 325 the second grid pattern is printed using the second mask. In step 330, the first and second grid pattern are then etched into the surface of the substrate. This single photoresist layer/single etch embodiment is generally made practical by having a very high contrast ratio photoresist. Such a photoresist will generally limit the undesirable proximity effects of the respective exposures adding incoherently in the single resist.

Figure 4:
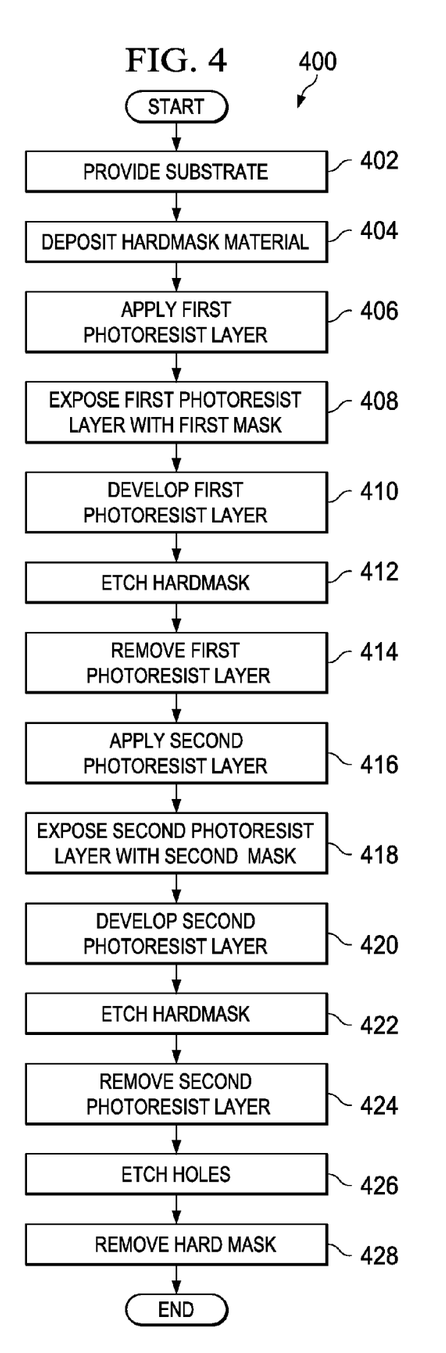
FIG. 4 shows steps in another exemplary method for fabricating an integrated circuit according to another embodiment of the invention.

If no photoresist having a very high contrast ratio is available to sufficiently avoid the undesirable effects of have two or more exposures adding incoherently in a single resist layer, in another embodiment of the invention, the respective grid patterns are printed using separate photoresist layers and separate exposures. This embodiment can also include optional separate etch steps. In this embodiment of the invention, a hard mask layer may also be added. FIG. 4 shows steps in an exemplary method 400 for fabricating an integrated circuit according to an embodiment of the invention which includes separate photoresist layers, separate exposures and separate etch steps. In step 402 a substrate is provided having a surface to have features to be defined therein. In step 404, a hardmask material is deposited, such as silicon nitride, silicon oxynitride, or a silicon oxide. In step 406, a first photoresist layer is applied. The first photoresist layer is exposed in step 408 using a mask having a first set of features positioned in a first grid pattern in at least one multi-transistor area. In step 410, the first photoresist layer is developed. In step 412, the hard mask layer is etched to form the first set of features in the hardmask material. In step 414 the first photoresist layer is removed. In step 416 the second photoresist layer is applied. The second photoresist layer is exposed in step 418 using a mask having a second set of features in a second grid pattern the multi-transistor area. In step 420, the second photoresist layer is developed. In step 422, the hard mask layer is etched to form the second set of features in the hardmask material. In step 424 the second photoresist layer is removed. In step 426, the features (e.g. contact or via holes) are etched. In step 428, the hardmask layer is removed.

Figure 5A:
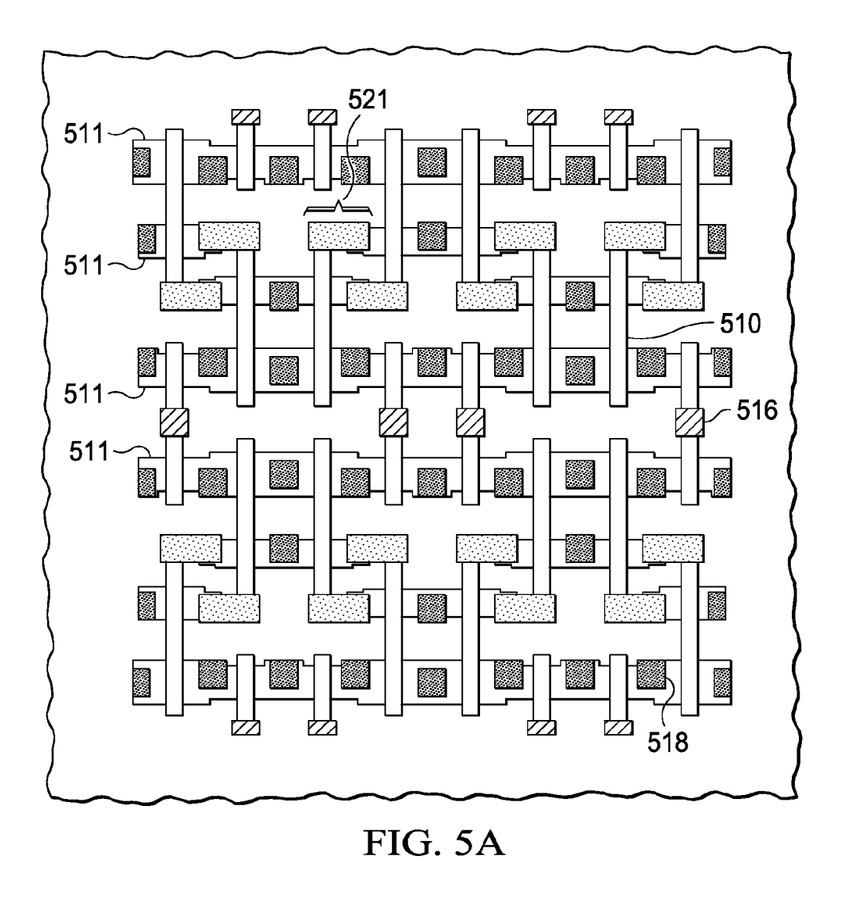
FIG. 5A shows the layout for a portion of an existing SRAM cell showing the respective diffusion/active levels, the gate electrode (e.g. polysilicon) and the contact level.

Certain existing device designs are well suited to embodiments of the present invention. In the cases of certain static rams (SRAMs), the contacts in the SRAM can essentially be partitioned into two sets of contacts that each couple well to a single illuminator for a similar logic gate pitch. FIG. 5A shows the layout for a portion of a typical modern SRAM 500 showing the respective diffusion/active levels, the gate electrode (e.g. polysilicon), and the contact level. Gate electrode lines 510 run vertical and parallel to one another. Diffusions 511 are the rectangles running in the horizontal direction. The small box-like structures shown are contacts, contacts to the gate electrode shown as 516 and contacts to the diffusions shown as 518. Some contacts are double-width or "stretch" contacts 521, which provide a low resistance electrical contact to both diffusion 511 and gate electrode 510.

Figure 5B:
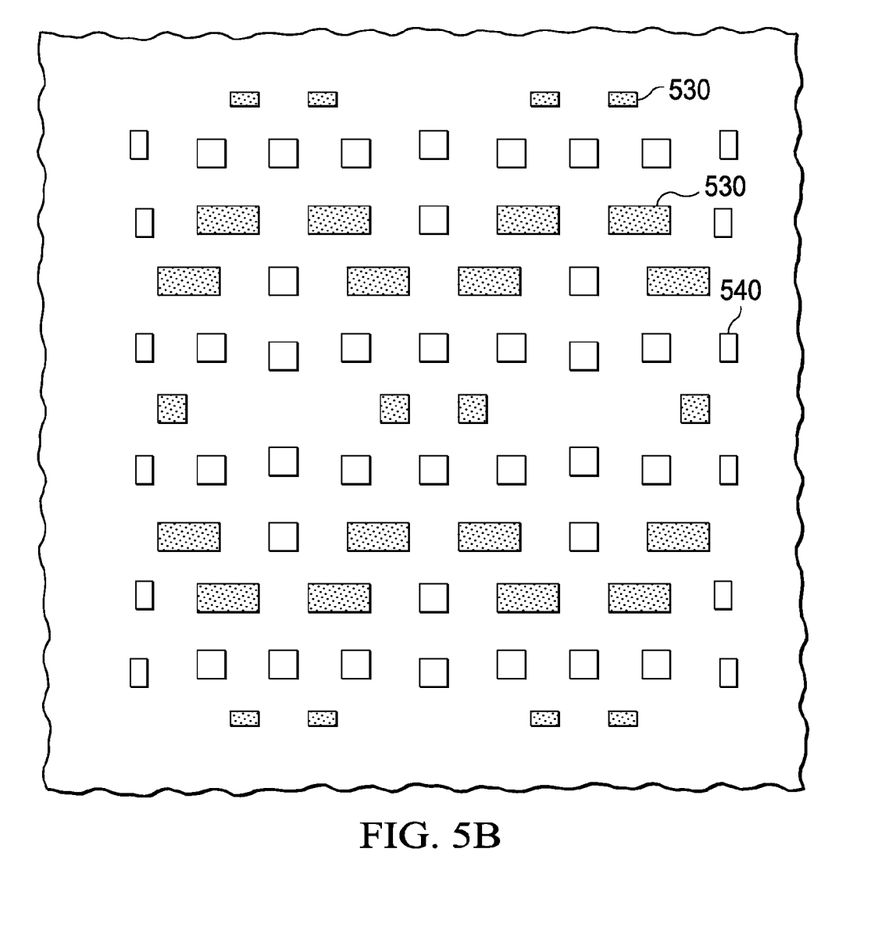
FIG. 5B shows the contact level for the SRAM portion shown in FIG. 5A divided into a first group of contacts which contact the gate electrode layer (shown dark) at least in part, and another group of contacts being the other contacts which only contact the active area (shown light), according to an embodiment of the invention.

FIG. 5B shows the contacts from the SRAM portion 500 shown in FIG. 5A divided into all contacts which contact the gate electrode layer at least in part (shown dark as 530), and the other contacts which only contact the active area (shown light as 540), according to an embodiment of the invention. Missing contact locations in the respective grids are generally provided as assist features in the respective masks as described above. The dark contacts 530 thus comprise contacts that at least touch gate electrode lines 510, including the double contacts 521, while the light contacts 540 are the contacts to the diffusions 511 that do not also contact the gate electrode lines 510. The overall pattern can be seen to be substantially on a grid. Using an embodiment of the invention for the contact mask level, one mask for the contact level would be used to print contacts 530 and another mask for the contact level would be used to print contacts 540. Each sub-pattern also appears to be substantially on a grid.

Figure 6A:
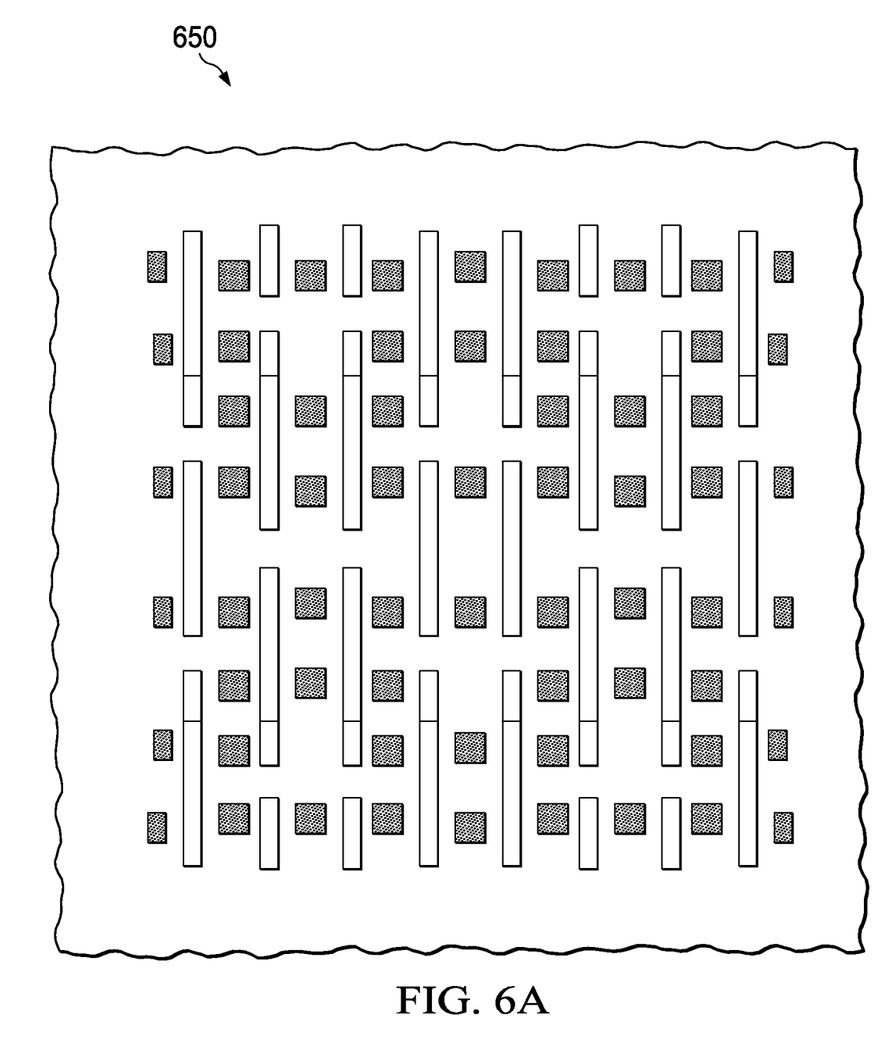
FIGS. 6A and 6B show the contact pattern shown in FIG. 5B modified so that the stretch contacts (contacts which contact the active area and gate electrode layer) are divided into diffusion/active contact grid (FIG. 6A) and a gate electrode contact grid (FIG. 6B), according to another embodiment of the invention.
Figure 6B:
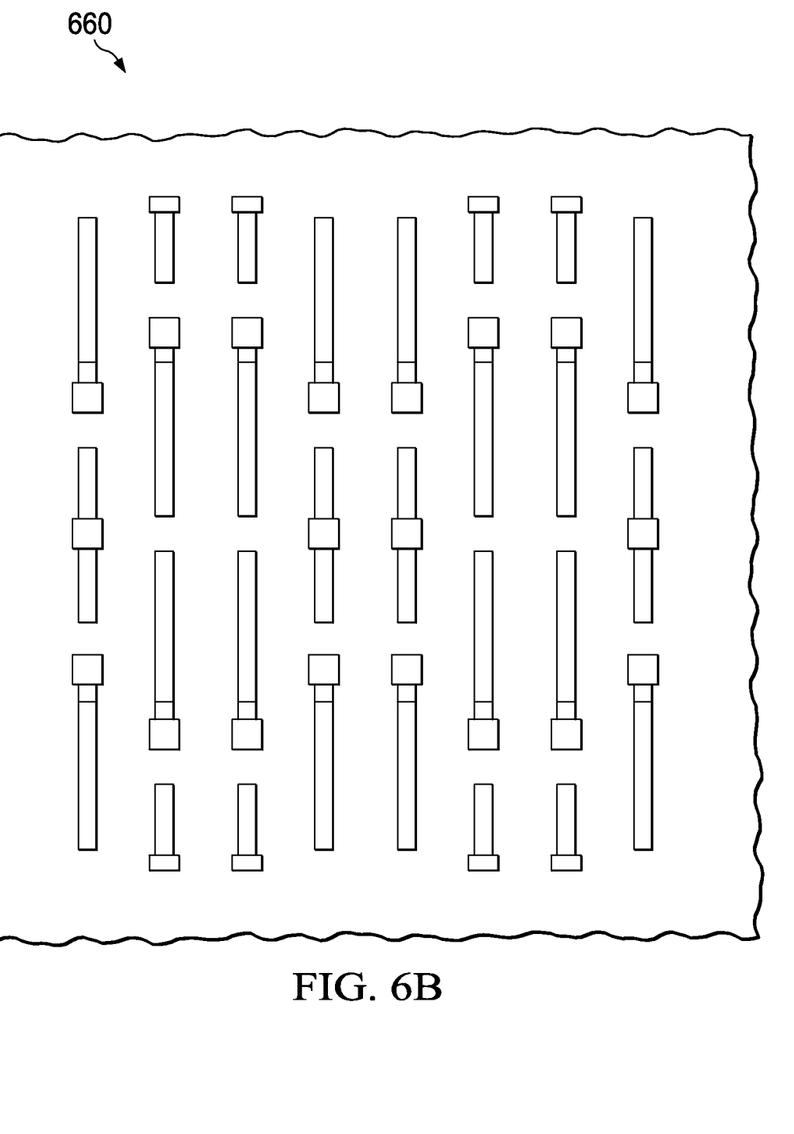

FIGS. 6A and 6B show the contact pattern shown in FIG. 5B modified so that the stretch contacts (contacts which contact the active area and gate electrode) are divided into diffusion/active contact grid 650 (FIG. 6A) and a gate electrode contact grid 660 (FIG. 6B), according to another embodiment of the invention. Missing contact locations in the respective grids are generally provided as assist features in the respective masks as described above. The active contact grid 650 shown in FIG. 6A is an almost perfect grid as is the gate electrode contact grid 660 shown in FIG. 6B. Whether final merging is to occur when the separate contact patterns are transferred into a hard mask, or when the resist patterns are directly transferred to the substrate or when the hard mask pattern is transferred to the substrate, the two pieces of the stretch contacts on the separate masks are generally adjusted such that the resulting pattern on the substrate at least partially merges the two pieces so as to provide an electrical path of sufficiently low electrical resistance between the gate and the active area diffusion.

FIGS. 5A-B and FIGS. 6A-B demonstrate the operation of the invention for existing circuit designs. However, as noted above, the invention can also be incorporated into design rules to provide more grid-like designs for certain mask levels to manufacture integrated circuits having improved printing, particularly for minimum spaced contacts and vias, such as shown in FIG. 2B in the case of contacts.

The semiconductor substrates may include various elements therein and/or layers thereon. These can include barrier layers, other dielectric layers, device structures, active elements and passive elements including, source regions, drain regions, bit lines, bases, emitters, collectors, conductive lines, conductive vias, etc. Moreover, the invention can be based on a variety of processes including CMOS and BiCMOS.

While various embodiments of the present invention have been described above, it should be understood that they have been presented by way of example only, and not limitation. Numerous changes to the disclosed embodiments can be made in accordance with the disclosure herein without departing from the spirit or scope of the invention, such as the use of negative photoresist instead of positive photoresist. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method for fabricating an integrated circuit, comprising the steps of:
   providing a substrate having a semiconductor surface;
   providing a hardmask material on said semiconductor surface;
   for at least one masking level of said integrated circuit;
   providing a mask pattern for said masking level partitioned into a first mask and at least one second mask,
   said first mask providing features in a first grid pattern and said at least one second mask providing features in a second grid pattern,
   wherein said first and said second grid pattern have respective features which interleave with one another over at least one area;
   applying a first photoresist layer with the first mask;
   exposing said first grid pattern using said first mask;
   developing said first photoresist layer;
   etching said hardmask material to transfer said first grid pattern in said surface of said substrate;
   removing said first photoresist layer;
   applying said second grid pattern using said second mask;
   applying a second photoresist layer;
   exposing said second photoresist layer;
   developing said second photoresist layer; and
   re-etching said previously etched hardmask transfer so as to further transfer said second grid patterns to form said interleaved features of said first grid pattern and said second grid pattern in said hardmask.

2. The method of claim 1, wherein said at least one area comprises a plurality of multi-transistor defining areas, said plurality of multi-transistor defining areas providing a plurality of different said feature patterns of said first grid pattern and said second grid pattern.

3. The method of claim 1, wherein said masking level comprises a contact level, said first mask defining source/drain contacts on said integrated circuit and said second mask defining gate electrode contacts on said integrated circuit.

4. The method of claim 1, wherein said masking level comprises a via level.

5. The method of claim 1, wherein said first photoresist film is used to print said first grid pattern, further comprising the step of applying a second photoresist film onto said surface of said substrate and using said second photoresist film to print said second grid pattern.

6. The method of claim 1, further comprising the step of depositing a hardmask layer on said semiconductor surface, and etching said first and said second grid pattern in said hardmask layer before said step of etching said surface of said substrate.

7. The method of claim 1, wherein said first grid pattern and said second grid pattern are both rectangular patterns.

8. The method of claim 1, wherein said features of said first grid pattern and said second grid pattern are positioned within 20% of being ½ pitched relative to one another along only one of an x-axis and a y-axis, wherein the half pitch is greater than zero percent.

9. The method of claim 1, wherein said features of said first grid pattern and said second grid pattern are positioned within 20% of being ½ pitched relative to one another along both said x-axis and said y-axis, wherein the half pitch is greater than zero percent.

10. The method of claim 1, wherein said masking level includes at least one merged feature comprising one of said features from said first grid pattern and one of said features from said second grid pattern.

11. The method of claim 1, wherein a center of said features of at least one of said first grid pattern and said second grid pattern are in said rows are positioned within a 10% tolerance from feature positions defined by a constant horizontal grid spacing.

12. The method of claim 11, wherein said center for all said features for said first and said second grid are positioned within ±10% relative to a placement of said features on grid points for said first and said second grid.

13. The method of claim 9, wherein a half-pitched feature of said first grid of said hardmask is interleaved with a feature of said second grid of said hardmask in a half pitch to create a composite feature of the first feature and the second feature.

14. The method of claim 13, wherein claim wherein the two grid-interleaving distances vary on at least two different regions of the same device so as to construct at least one region on the chip where composite features are formed at least one other region where the two grids form no composite features.

15. The method of claim 1, further comprising removing said second photoresist layer.

16. The method of claim 15, further comprising etching holes through said interleaved hardmask.

17. The method of claim 16, further comprising removing said interleaved hard mask.

* * * * *